United States Patent
Yoshikawa et al.

(10) Patent No.: US 11,088,006 B2
(45) Date of Patent: Aug. 10, 2021

(54) ELECTROSTATIC CHUCK

(71) Applicant: SHINKO ELECTRIC INDUSTRIES CO., LTD., Nagano (JP)

(72) Inventors: Takamasa Yoshikawa, Nagano (JP); Hiroharu Yanagisawa, Nagano (JP); Nobuyuki Iijima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 112 days.

(21) Appl. No.: 16/430,569

(22) Filed: Jun. 4, 2019

(65) Prior Publication Data
US 2019/0385883 A1    Dec. 19, 2019

(30) Foreign Application Priority Data

Jun. 15, 2018 (JP) .............................. JP2018-114381

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC ...................... H01L 21/6833; H01L 21/67103
See application file for complete search history.

(56) References Cited

U.S. PATENT DOCUMENTS

| | | | |
|---|---|---|---|
| 6,071,630 A * | 6/2000 | Tomaru | B23Q 3/154 279/128 |
| 9,240,340 B2 | 1/2016 | Shiraiwa et al. | |
| 9,520,314 B2 * | 12/2016 | Sun | H01L 21/6833 |
| 2005/0042881 A1 * | 2/2005 | Nishimoto | H01L 21/67248 438/710 |
| 2008/0266746 A1 * | 10/2008 | Handa | H01L 21/6831 361/234 |
| 2019/0019714 A1 * | 1/2019 | Kosakai | H01L 21/67248 |
| 2020/0343125 A1 * | 10/2020 | Kinpara | H02N 13/00 |

FOREIGN PATENT DOCUMENTS

| | | |
|---|---|---|
| JP | 2013-229464 | 11/2013 |
| JP | 2014-165459 | 9/2014 |

\* cited by examiner

*Primary Examiner* — Kyle J Moody
(74) *Attorney, Agent, or Firm* — IPUSA, PLLC

(57) ABSTRACT

An electrostatic chuck includes a platform, a power feed pin, a tubular insulator, an adhesive layer, and a first primer. The platform includes an electrode. The power feed pin contacts the electrode. The tubular insulator is provided around the power feed pin. The adhesive layer bonds the platform and the tubular insulator together. The first primer is provided on a surface of the tubular insulator facing toward the adhesive layer.

4 Claims, 6 Drawing Sheets

ELECTROSTATIC CHUCK

CROSS-REFERENCE TO RELATED APPLICATION

This application is based upon and claims the benefit of priority of the prior Japanese Patent Application No. 2018-114381, filed on Jun. 15, 2018, the entire contents of which are incorporated herein by reference.

FIELD

A certain aspect of the embodiments discussed herein is related to electrostatic chucks.

BACKGROUND

Conventionally, semiconductor manufacturing apparatuses such as dry etching apparatuses used in a semiconductor wafer process are provided with an electrostatic chuck onto which a wafer is electrostatically attracted and placed to control wafer temperature during wafer processing. The electrostatic chuck is also used to electrostatically attract a display device.

The electrostatic chuck includes a platform including an electrostatic electrode and a connecting electrode connected to the electrostatic electrode; and a connector including a power feed pin connected to the connecting electrode. The connector is accommodated in a baseplate. See, for example, Japanese Laid-open Patent Publication Nos. 2013-229464 and 2014-165459.

SUMMARY

According to an aspect of the present invention, an electrostatic chuck includes a platform, a power feed pin, a tubular insulator, an adhesive layer, and a first primer. The platform includes an electrode. The power feed pin contacts the electrode. The tubular insulator is provided around the power feed pin. The adhesive layer bonds the platform and the tubular insulator together. The first primer is provided on a surface of the tubular insulator facing toward the adhesive layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

The attraction force of the electrostatic chuck, which is a force to electrostatically attract an object as described above, may decrease during use of the electrostatic chuck. When the attraction force decreases, the electrostatically attracted object may drop off from the electrostatic chuck.

The inventors of the present invention have diligently worked to identify the cause of a decrease in the attraction force of conventional electrostatic chucks during their use. The detailed analysis by the inventors has revealed that discharge occurs between the tip of the power feed pin and a heater. This new finding is described herein.

Figure 1:
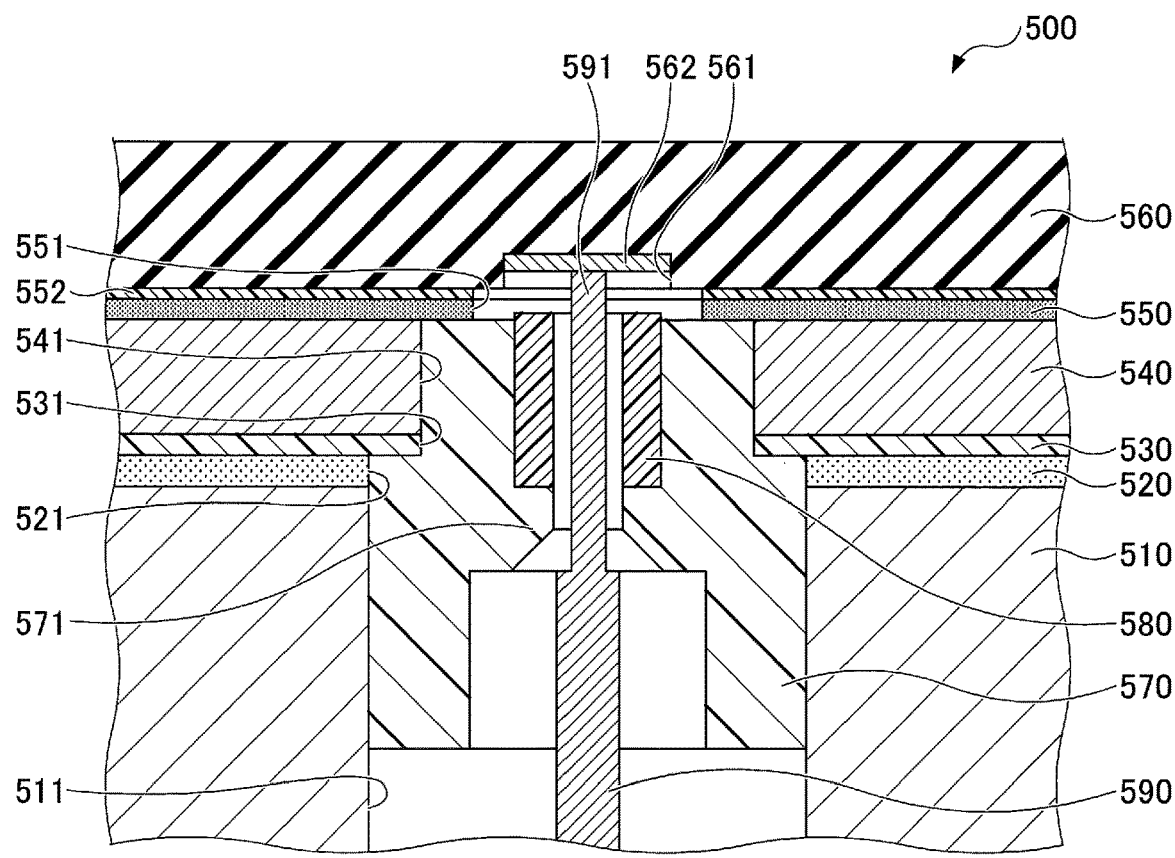
FIG. 1 is a sectional view of a reference example of an electrostatic chuck.

FIG. 1 is a sectional view of a reference example of an electrostatic chuck. As illustrated in FIG. 1, an electrostatic chuck 500 according to the reference example includes a baseplate 510 in which a through hole 511 is formed. A heater 540 is bonded onto the baseplate 510 by a first adhesive layer 520. An insulating film 530 is provided on a surface of the heater 540 facing toward the baseplate 510.

An opening 521 is formed in the first adhesive layer 520 at a position corresponding to the through hole 511 of the baseplate 510. Openings 531 and 541 are provided in the insulating film 530 and the heater 540, respectively, over the opening 521 of the first adhesive layer 520.

A first tubular insulator 570 is placed in the through hole 511 and the openings 531 and 541 in contact with the inner walls of the baseplate 510, the insulating film 530, and the heater 540. The first tubular insulator 570 includes an annular protruding portion 571 that protrudes inward.

A second tubular insulator 580 is placed on the protruding portion 571 of the first tubular insulator 570. The second tubular insulator 580 has substantially the same inner diameter as the protruding portion 571 of the first tubular insulator 570.

A platform 560 is bonded onto the heater 540 and the first tubular insulator 570 by a second adhesive layer 550. An opening 551 is provided in the second adhesive layer 550 at a position corresponding to the opening 541 of the heater 540.

A recess 561 is formed in the platform 560 at a position corresponding to the opening 541 of the heater 540. A primer 552 is applied on a surface of the platform 560 around the recess 561. The platform 560 includes a connecting electrode 562 at the bottom of the recess 561. The connecting electrode 562 is connected to an electrostatic electrode (not depicted) formed in the platform 560.

A connector 590 having a power feed pin 591 is inserted into the recess 561 of the platform 560 through the through hole 511 of the baseplate 510. The power feed pin 591 contacts the connecting electrode 562. The power feed pin 591 is coupled to a spring (not depicted) in the connector 590 to be pressed against the connecting electrode 562 by the elastic force of the spring.

The power feed pin 591 of the connector 590 thus contacts the connecting electrode 562 of the platform 560 to apply a voltage of approximately 3000 V to approximately 6000 V to the electrostatic electrode (not depicted) connected to the connecting electrode 562.

Figure 2:
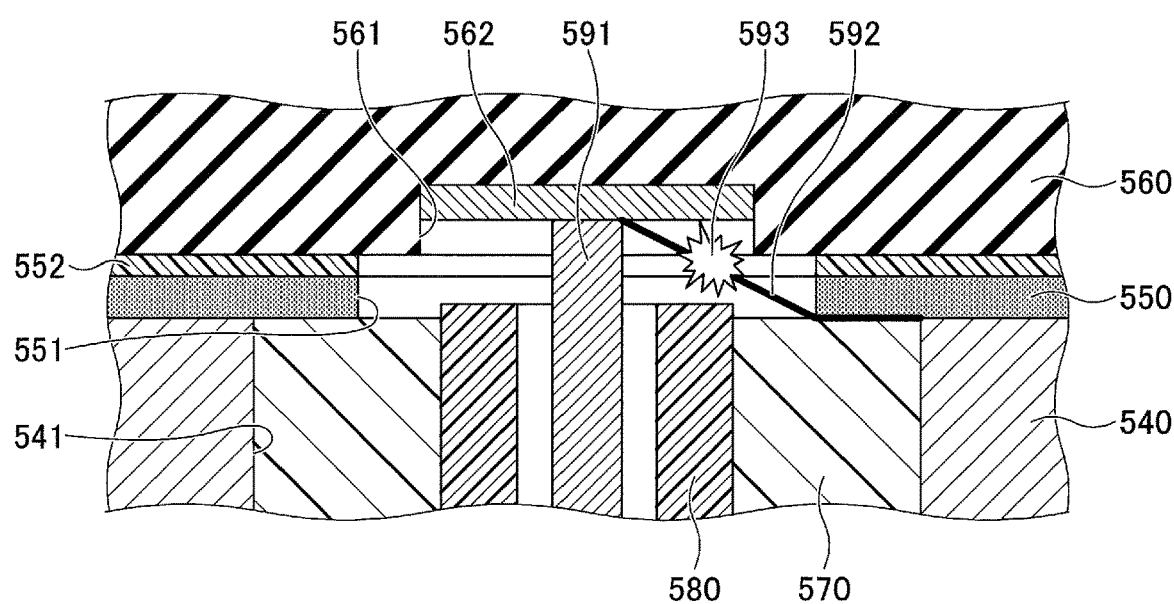
FIG. 2 is an enlarged view of the tip of a power feed pin of the reference example and its vicinity.

According to the electrostatic chuck 500 of this reference example, discharge may occur between the tip of the power feed pin 591 and the heater 540. FIG. 2 is an enlarged view of the tip of the power feed pin 591 and its vicinity.

For example, the heater 540 is made of aluminum or an aluminum alloy, and a discharge 593 may occur in a path 592 between the tip of the power feed pin 591 and the heater 540, using a slight gap between the second adhesive layer 550 and the first tubular insulator 570 as a path, as illustrated in FIG. 2. Once the discharge 593 occurs, the application of voltage to the electrostatic electrode in the platform 560 is stopped to cause a sudden decrease in the attraction force of the electrostatic chuck 500.

Such a phenomenon has been neither elucidated nor addressed. Under such circumstances, the inventors have furthered their work to reveal that application of a primer on the bonding surface of the first tubular insulator 570 before bonding using the second adhesive layer 550 improves adhesion between the first tubular insulator 570 and the second adhesive layer 550 to make it possible to control the discharge 593.

Based on these new findings, the inventors have arrived at the following embodiments, which are specifically described below with reference to the accompanying drawings. In the following, elements having substantially the same functional configuration are referred to using the same reference numeral, and duplicate description thereof may be omitted.

First Embodiment

Figure 3:
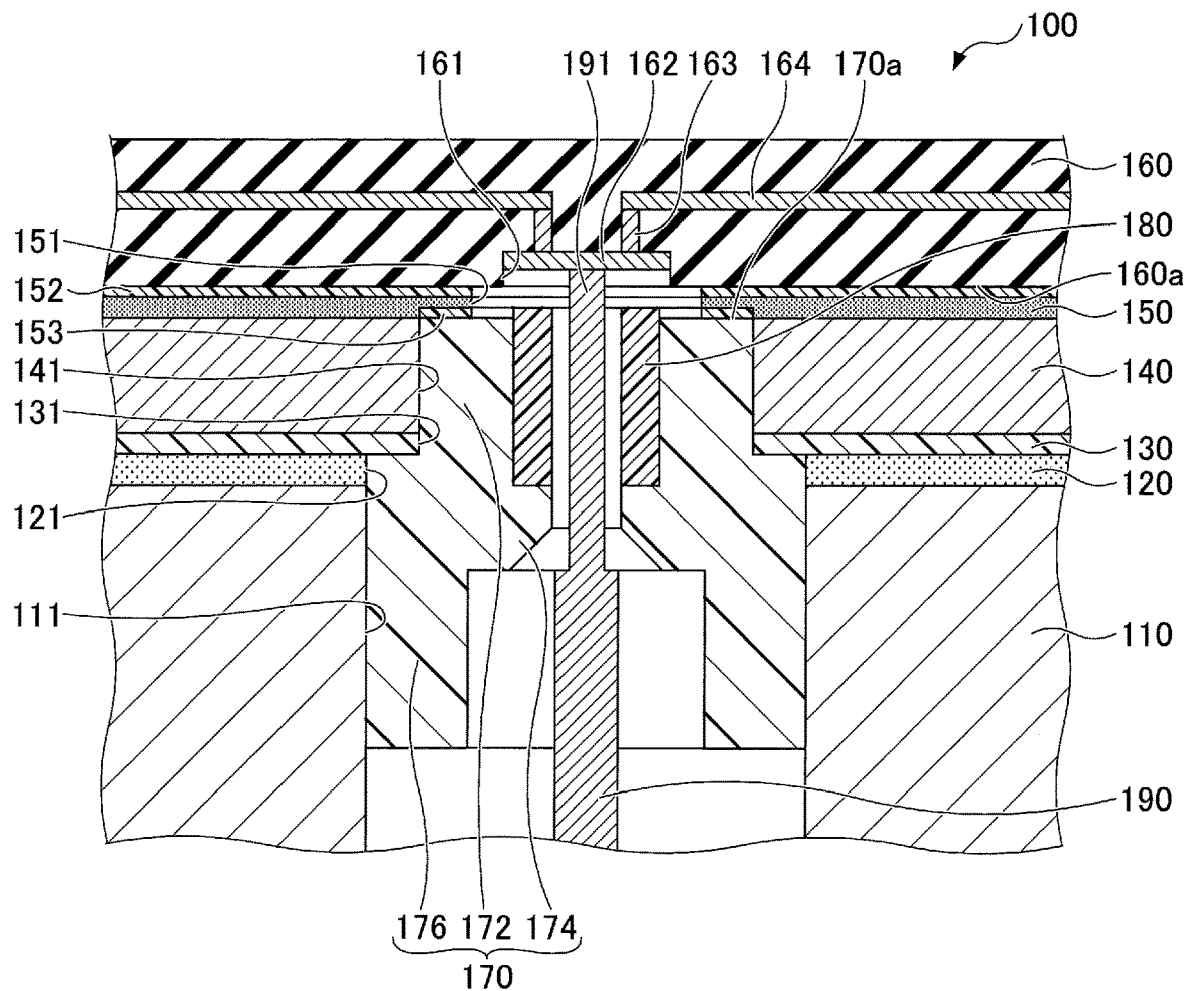
FIG. 3 is a sectional view of an electrostatic chuck according to a first embodiment.

A description is given of a first embodiment, which relates to an electrostatic chuck. FIG. 3 is a sectional view of an electrostatic chuck 100 according to the first embodiment.

Referring to FIG. 3, the electrostatic chuck 100 includes a baseplate 110 in which a through hole 111 is formed. A heater 140 is bonded onto the baseplate 110 by a first adhesive layer 120. An insulating film 130 is provided on a surface of the heater 140 facing toward the baseplate 110.

For example, the baseplate 110 and the heater 140 are metallic components made principally of aluminum or an aluminum alloy, a silicone resin-based adhesive is used for the first adhesive layer 120, and the insulating film 130 is a polyimide film. For example, the thickness of the first adhesive layer 120 is 1 mm to 1.5 mm, and the diameter of the through hole 111 is 5 mm to 6 mm.

An opening 121 is provided in the first adhesive layer 120 at a position corresponding to the through hole 111. Openings 131 and 141, which are smaller in diameter than the opening 121, are provided in the insulating film 130 and the heater 140, respectively, over the opening 121.

A first tubular insulator 170 is placed in an upper end portion of the through hole 111 and in the openings 131 and 141 in contact with the inner walls of the baseplate 110, the insulating film 130, and the heater 140. The first tubular insulator 170 includes, in order from top to bottom, an upper tubular portion 172, an annular protruding portion 174 that protrudes inward, and a lower tubular portion 176. The upper tubular portion 172 is placed in the opening 141 with its outside surface contacting the inner wall of the heater 140. The protruding portion 174 and the lower tubular portion 176 are placed in the opening 121 and the through hole 111 with their respective outside surfaces contacting the inner walls of the first adhesive layer 120 and the baseplate 110. The protruding portion 174 has a smaller inner diameter than the upper tubular portion 172. The lower tubular portion 176 has a larger inner diameter than the upper tubular portion 172.

A second tubular insulator 180 is placed on the upper surface of the protruding portion 174 of the first tubular insulator 170. The inner diameter of the second tubular insulator 180 is uniform over the entire length of the second tubular insulator 180 in its axial direction. The inner diameter of the second tubular insulator 180 is substantially the same as the inner diameter of the protruding portion 174 of the first tubular insulator 170.

For example, the first tubular insulator 170 is made principally of polyether ether ketone (PEEK), and the second tubular insulator 180 is made principally of polyether imide.

A platform 160 for placing an object such as a wafer is bonded onto the heater 140 and the first tubular insulator 170 by a second adhesive layer 150. An opening 151 is provided in the second adhesive layer 150 at a position corresponding to the opening 141 of the heater 140. The platform 160 includes a recess 161 at a position corresponding to the opening 141. For example, the thickness of the second adhesive layer 150 is 1 mm to 1.5 mm.

A first primer 153 is applied on an upper surface 170a, namely, a surface facing toward the second adhesive layer 150, of the first tubular insulator 170. The second adhesive layer 150 contacts the first tubular insulator 170 through the first primer 153. A second primer 152 is applied on a lower surface 160a, namely, a surface facing toward the second adhesive layer 150, of the platform 160 around the recess 161, and the second adhesive layer 150 contacts the platform 160 through the second primer 152.

The first primer 153 and the second primer 152 contain, for example, 40% by mass to 80% by mass of isopropyl alcohol, 10% by mass to 20% by mass of bisphenol A epichlorohydrin resin, and 10% by mass to 20% by mass of γ-glycidoxypropyltrimethoxysilane.

The platform 160 includes a connecting electrode 162 at the bottom of the recess 161. A via conductor 163 and an electrostatic electrode 164 are buried in the platform 160, and the electrostatic electrode 164 is connected to the connecting electrode 162 through the via conductor 163. Thus, the platform 160 includes the connecting electrode 162 at a position corresponding to the through hole 111 of the baseplate 110.

For example, a silicone resin-based adhesive is used for the second adhesive layer 150, and the platform 160 is made of a ceramic whose principal component is aluminum oxide.

The platform 160 may be manufactured in the following manner. According to a method of manufacturing the platform 160, tungsten paste to become the connecting electrode 162, the via conductor 163, and the electrostatic electrode 164 is formed on a surface and in a through hole of a green sheet, and multiple green sheets are stacked and fired.

A connector 190 including a power feed pin 191 is inserted into the recess 161 of the platform 160 through the through hole 111 of the baseplate 110. The power feed pin 191 contacts the connecting electrode 162. The power feed pin 191 is coupled to a spring (not depicted) in the connector 190 to be pressed against the connecting electrode 162 by the elastic force of the spring. For example, the diameter of the power feed pin 191 is 2 mm to 3 mm.

The power feed pin 191 thus contacts the connecting electrode 162 to apply a voltage of approximately 3000 V to approximately 6000 V to the electrostatic electrode 164 through the connecting electrode 162 and the via conductor 163.

According to the electrostatic chuck 100 thus configured, the first primer 153 is applied on the surface of the first tubular insulator 170 facing toward the second adhesive layer 150, and the second adhesive layer 150 contacts the first tubular insulator 170 via the first primer 153. Accordingly, unlike the reference example, there is no gap between the second adhesive layer 150 and the first tubular insulator 170, so that such discharge as to occur in the reference example is extremely unlikely to occur between the tip of the power feed pin 191 and the heater 140. Therefore, it is possible to control a decrease in the attraction force due to discharge between the tip of the power feed pin 191 and the heater 140, so that it is possible to improve the stability of electrostatic attraction.

Next, a method of manufacturing the electrostatic chuck 100 is described. FIGS. 4A through 4F are sectional views illustrating a method of manufacturing the electrostatic chuck 100 according to the first embodiment.

Figure 4A:
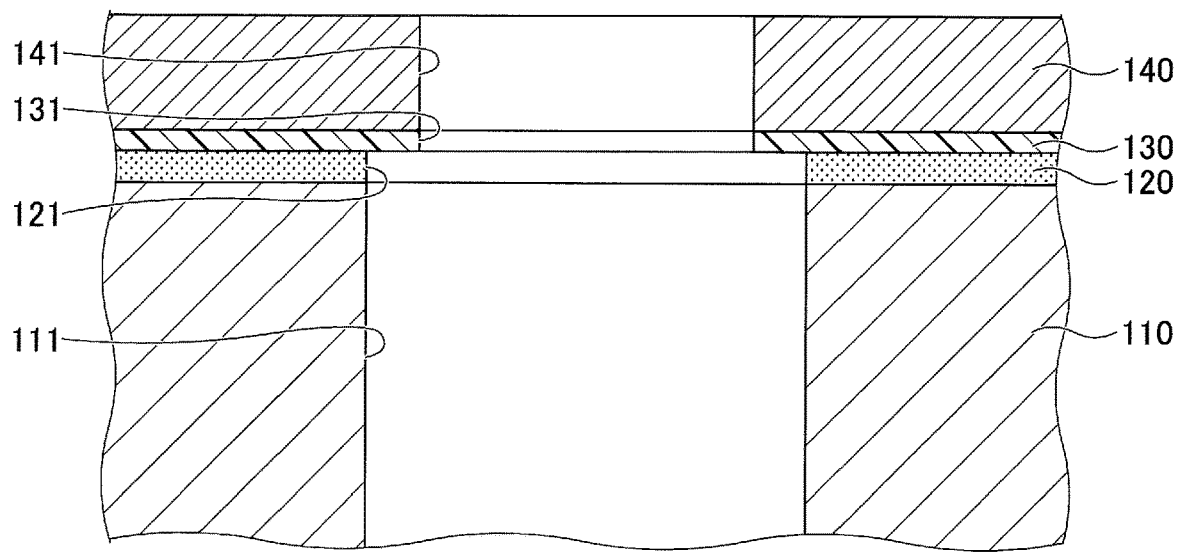
FIGS. 4A through 4F are sectional views illustrating a method of manufacturing the electrostatic chuck according to the first embodiment.

First, as illustrated in FIG. 4A, the heater 140 to which the insulating film 130 is adhered is prepared, and the baseplate 110 and the insulating film 130 are bonded together using an adhesive. As a result, a one-piece structure of the baseplate 110, the first adhesive layer 120, the insulating film 130, and the heater 140 is obtained.

Figure 4B:
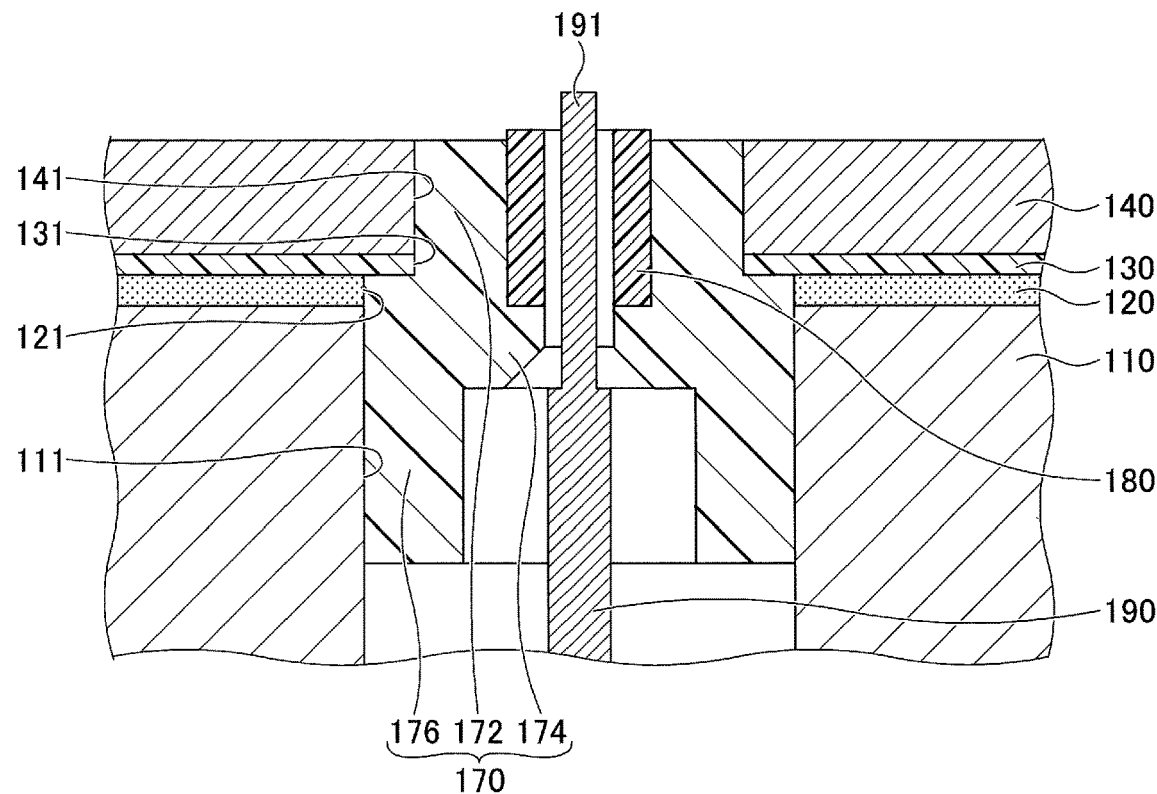

Next, as illustrated in FIG. 4B, the first tubular insulator 170, the second tubular insulator 180, and the connector 190 are inserted into the through hole 111 and the openings 121, 131 and 141.

Figure 4C:
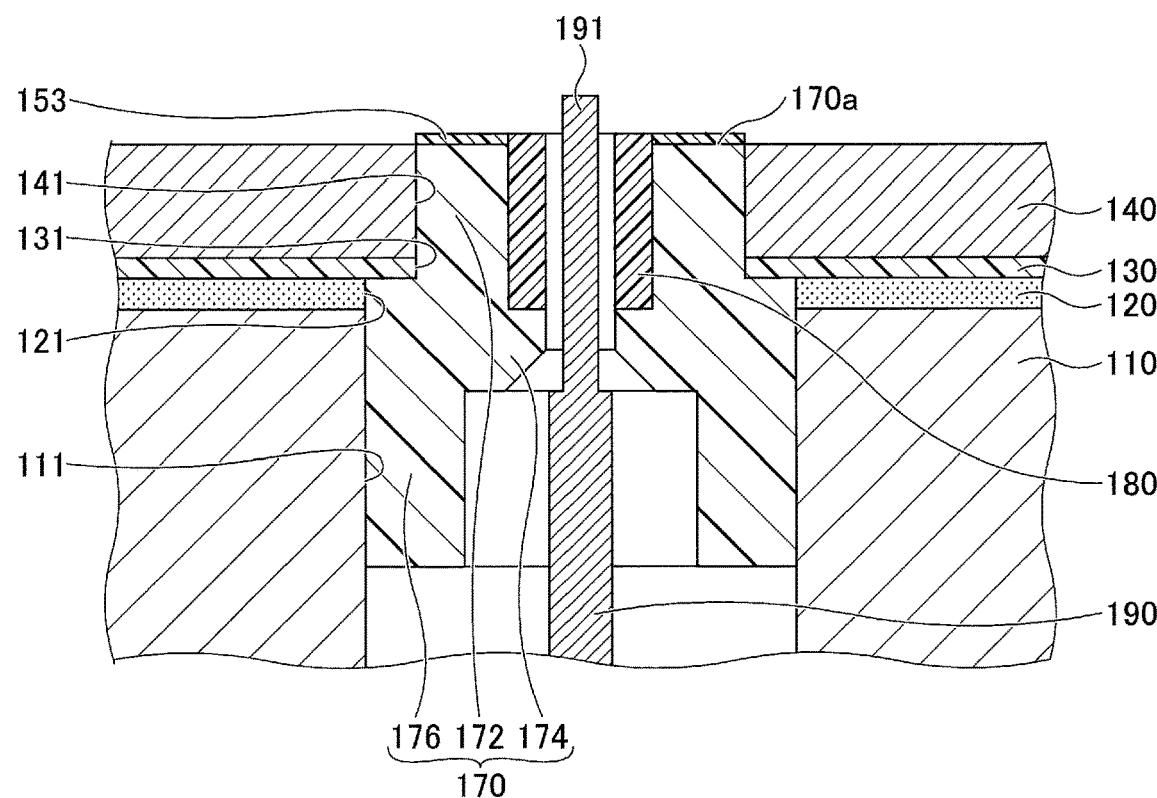

Thereafter, as illustrated in FIG. 4C, the first primer 153 is applied on the upper surface 170a of the first tubular insulator 170. For example, when the platform 160 has a suitable size for placement of a wafer of 300 mm in diameter, the amount of application of the first primer 153 over the entire upper surface 170a of the first tubular insulator 170 is 1 mL to 2 mL.

Figure 4D:
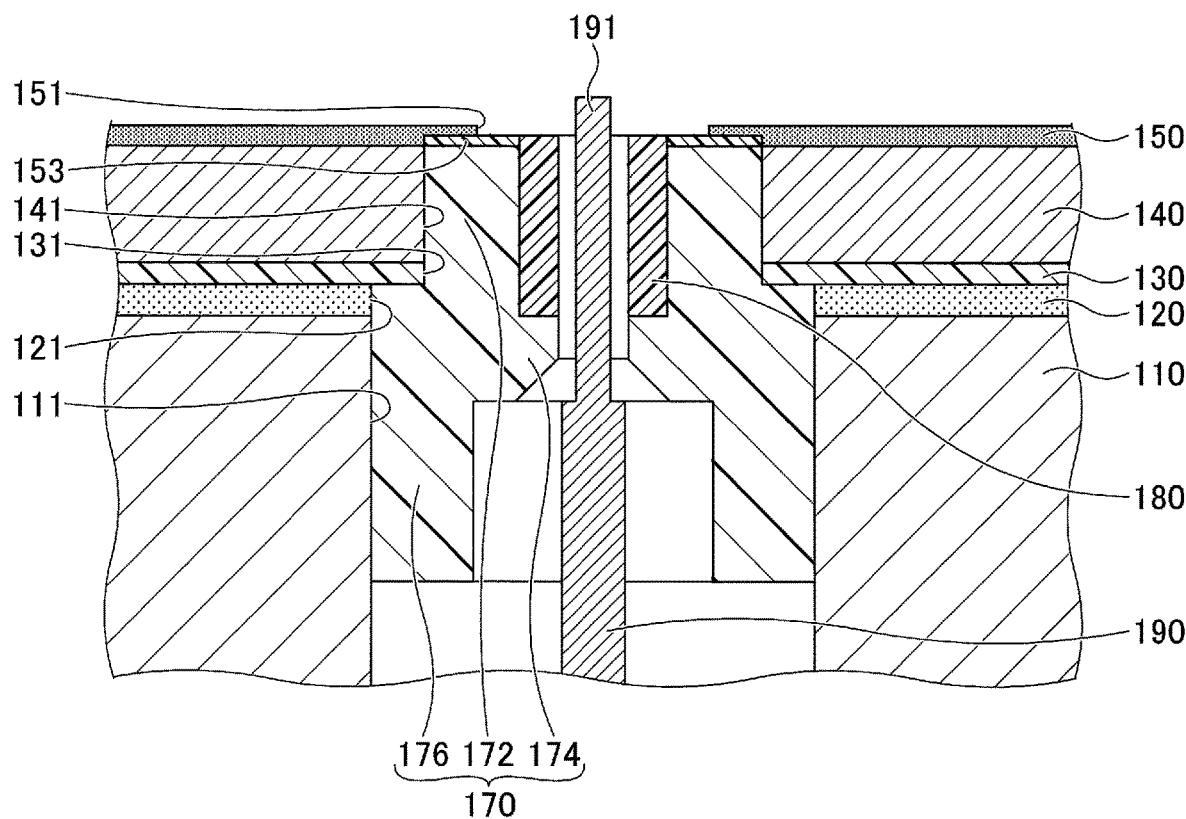

Next, as illustrated in FIG. 4D, the second adhesive layer 150 is formed over the heater 140 and the first tubular insulator 170. The second adhesive layer 150 may be formed by, for example, screen printing. At this point, the second adhesive layer 150 firmly adheres to the first tubular insulator 170 because of the first primer 153 applied on the upper surface 170a of the first tubular insulator 170.

Figure 4E:
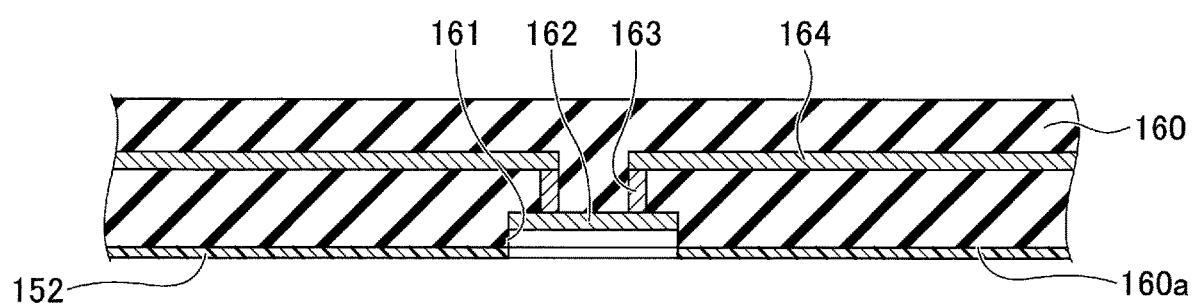

Furthermore, as illustrated in FIG. 4E, the platform 160 in which the recess 161 is formed and that includes the connecting electrode 162, the via conductor 163, and the electrostatic electrode 164 is prepared, and the second primer 152 is applied on the lower surface 160a of the platform 160 around the recess 161. For example, when the platform 160 has a suitable size for placement of a wafer of 300 mm in diameter, the amount of application of the second primer 152 over the entire lower surface 160a of the platform 160 is 1 mL to 2 mL.

Figure 4F:
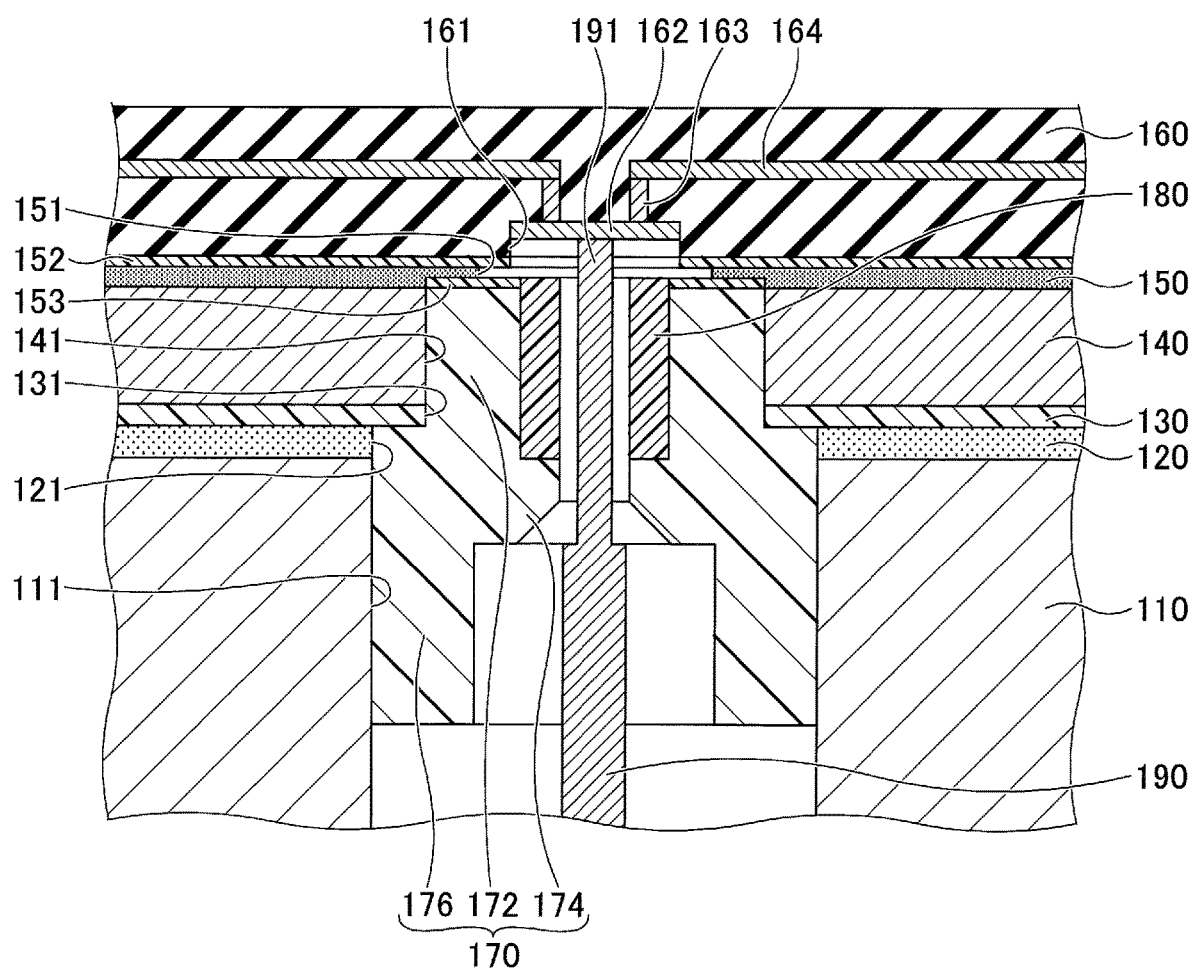

Then, as illustrated in FIG. 4F, the platform 160 is bonded to the heater 140 and the first tubular insulator 170 through the second adhesive layer 150. Next, the first primer 153 and the second primer 152 protruding from the second adhesive layer 150 are let to volatilize.

The electrostatic chuck 100 illustrated in FIG. 3 can thus be manufactured. The first primer 153 and the second primer 152 protruding from the second adhesive layer 150 may be let to either remain or spontaneously volatilize.

Second Embodiment

Figure 5:
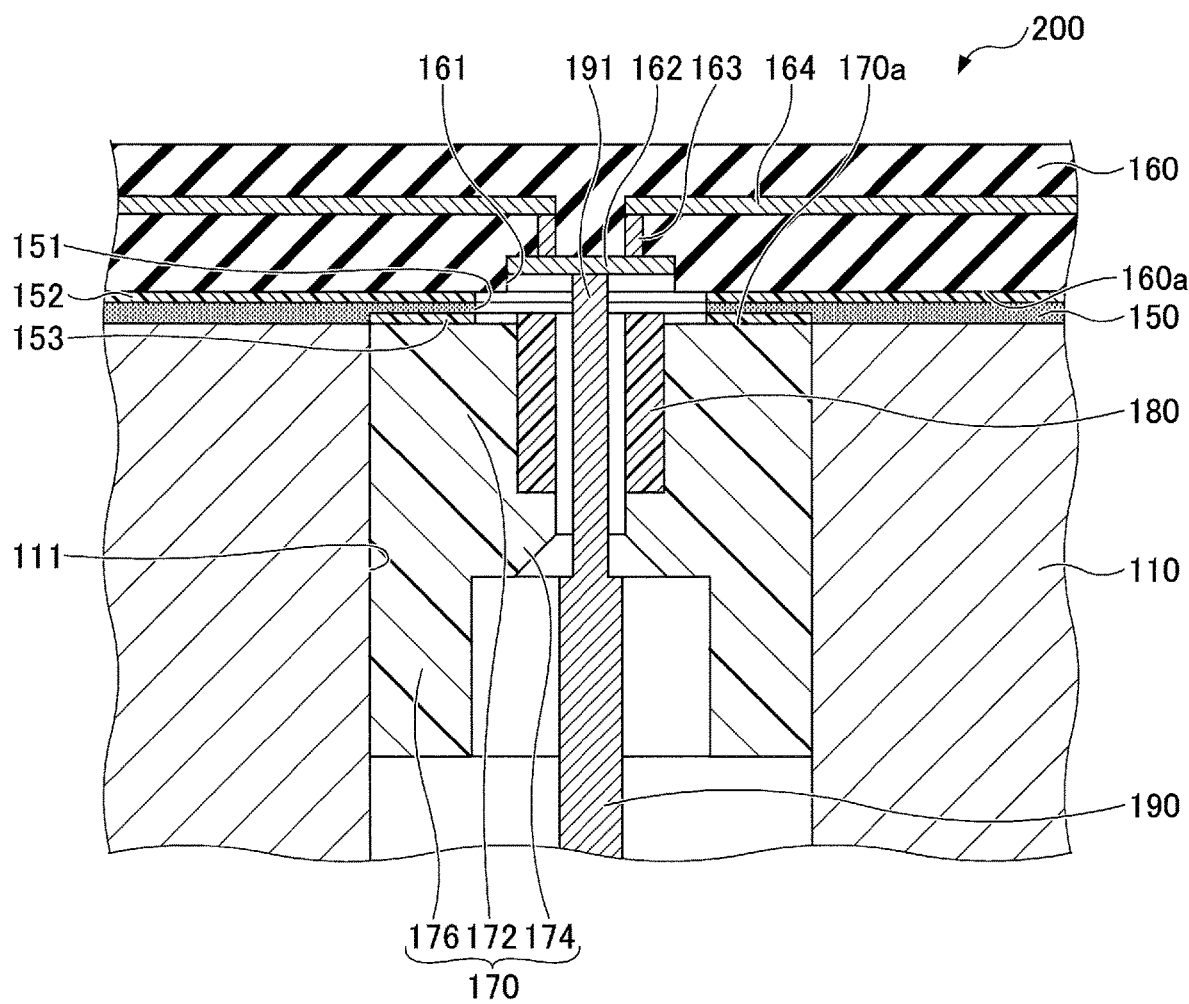
FIG. 5 is a sectional view of an electrostatic chuck according to a second embodiment.

Next, a description is given of a second embodiment, which relates to an electrostatic chuck. FIG. 5 is a sectional view of an electrostatic chuck 200 according to the second embodiment.

According to the electrostatic chuck 200 of the second embodiment, the platform 160 includes a heater, and the electrostatic chuck 200 does not include the heater 140, the insulating film 130, and the first adhesive layer 120.

The first tubular insulator 170 is placed in an upper end portion of the through hole 111 in contact with the inner wall of the baseplate 110. The upper tubular portion 172, the protruding portion 174, and the lower tubular portion 176 of the first tubular insulator 170 are in the through hole 111 with their respective outside surfaces contacting the inner wall of the baseplate 110.

The platform 160 is bonded onto the baseplate 110 and the first tubular insulator 170 by the second adhesive layer 150. The first primer 153 is applied on the upper surface 170a of the first tubular insulator 170, and the second adhesive layer 150 contacts the first tubular insulator 170 through the first primer 153.

Otherwise, the configuration of the second embodiment may be equal to the configuration of the first embodiment.

According to the electrostatic chuck 200 thus configured as well, the first primer 153 is applied on the surface of the first tubular insulator 170 facing toward the second adhesive layer 150, and the second adhesive layer 150 contacts the first tubular insulator 170 via the first primer 153. Accordingly, unlike the reference example, there is no gap between the second adhesive layer 150 and the first tubular insulator 170, so that such discharge as to occur in the reference example is extremely unlikely to occur between the tip of the power feed pin 191 and the baseplate 110. Therefore, it is possible to control a decrease in the attraction force due to discharge between the tip of the power feed pin 191 and the baseplate 110, so that it is possible to improve the stability of electrostatic attraction the same as in the first embodiment.

The electrostatic chuck 200 according to the second embodiment may be manufactured in the following manner, for example.

First, the first tubular insulator 170, the second tubular insulator 180, and the connector 190 are inserted into the through hole 111 of the baseplate 110. Next, in the same manner as in the first embodiment, the first primer 153 is applied on the upper surface 170a of the first tubular insulator 170. Thereafter, the second adhesive layer 150 is formed over the baseplate 110 and the first tubular insulator 170. Furthermore, in the same manner as in the first embodiment, the platform 160 in which the recess 161 is formed and that includes the connecting electrode 162, the via conductor 163, and the electrostatic electrode 164 is prepared, and the second primer 152 is applied on the lower surface 160a of the platform 160 around the recess 161. Then, the platform 160 is bonded to the baseplate 110 and the first tubular insulator 170 through the second adhesive layer 150. Next, the first primer 153 and the second primer 152 protruding from the second adhesive layer 150 are let to volatilize.

The electrostatic chuck 200 illustrated in FIG. 5 can thus be manufactured. The first primer 153 and the second primer 152 protruding from the second adhesive layer 150 may be let to either remain or spontaneously volatilize.

According to an aspect of the present invention, an electrostatic chuck that can improve the stability of electrostatic attraction is provided.

According to an aspect of the present invention, it is possible to improve the stability of electrostatic attraction.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing an electrostatic chuck, including:

applying a first primer on a surface of a tubular insulator provided around a power feed pin; and bonding a platform including an electrode to the surface of the tubular insulator on which the first primer is applied, using an adhesive, while keeping the power feed pin in contact with the electrode.

2. The method of clause 1, wherein bonding the platform includes forming a layer of the adhesive over the surface of the tubular insulator on which the first primer is applied by screen printing.

3. The method of clause 1, wherein bonding the platform includes applying a second primer on a surface of the platform to be bonded to the tubular insulator.

What is claimed is:

1. An electrostatic chuck comprising:
a platform including an electrode;
a power feed pin contacting the electrode;
a tubular insulator provided around the power feed pin;
a first primer provided on a surface of the tubular insulator facing toward the platform;
a metallic component provided outside the tubular insulator; and
an adhesive layer bonding the platform and each of the tubular insulator and the metallic component together,
wherein the first primer is interposed between the tubular insulator and the adhesive layer, and
the adhesive layer is in direct contact with the metallic component without an interposition of the first primer.

2. The electrostatic chuck as claimed in claim 1, further comprising:
a second primer provided on a surface of the platform facing toward the adhesive layer.

3. The electrostatic chuck as claimed in claim 1, wherein the metallic component is a heater.

4. The electrostatic chuck as claimed in claim 1, wherein the metallic component is a baseplate.

* * * * *